United States Patent [19]

Munson et al.

[11] 3,934,084

[45] Jan. 20, 1976

[54] VARIABLE GAIN AMPLIFIER CONTROLLED BY AMBIENT NOISE LEVEL

[75] Inventors: Robert Thomas Munson, St. Peter; Philip Hodgson, St. Martin, both of Jersey, Channel Islands

[73] Assignee: Television Research Limited, St. Helier, Jersey, Channel Islands

[22] Filed: Mar. 27, 1974

[21] Appl. No.: 455,373

[52] U.S. Cl. ............................. 179/1 VL; 179/1 P
[51] Int. Cl.$^2$ ........................................ H03G 1/02
[58] Field of Search......... 179/1 A, 1 MN, 1 N, 1 P, 179/1 VL; 330/51, 29, 144, 86, 110

[56] References Cited
UNITED STATES PATENTS

| | | | |
|---|---|---|---|
| 2,503,391 | 4/1950 | Kannenberg | 179/1 P |
| 2,564,437 | 8/1951 | Kannenberg | 179/1 P |
| 2,575,990 | 11/1951 | Augustadt | 179/1 P |
| 2,616,971 | 11/1952 | Kannenberg | 179/1 P |
| 2,668,874 | 2/1954 | Augustadt | 179/1 P |
| 3,296,373 | 1/1967 | Suganuma | 179/1 P |
| 3,410,958 | 11/1968 | Cohen | 179/1 P |
| 3,444,323 | 5/1969 | Nagashima et al. | 179/1 VL |

OTHER PUBLICATIONS

Simple Digitally-Controlled Variable-Gain Linear D.C. Amplifier, by Sedra et al., Electronic Engineering, Mar. 1969, pp. 362–365.

*Primary Examiner*—Kathleen H. Claffy
*Assistant Examiner*—Thomas D'Amico
*Attorney, Agent, or Firm*—Laurence R. Brown

[57] ABSTRACT

An audio amplifier system is provided comprising a variable gain amplifier adapted to receive an input signal, means for detecting periods when the input signal falls below a predetermined level, and sound transducer means arranged to provide a signal proportional to the sound level in the area or part thereof covered by the system for controlling the gain of the amplifier. An inhibitor is provided which is arranged to be controlled by the detecting means so as to prevent any change of the gain of the variable gain amplifier except during periods when the input signal falls below the said predetermined level.

4 Claims, 1 Drawing Figure

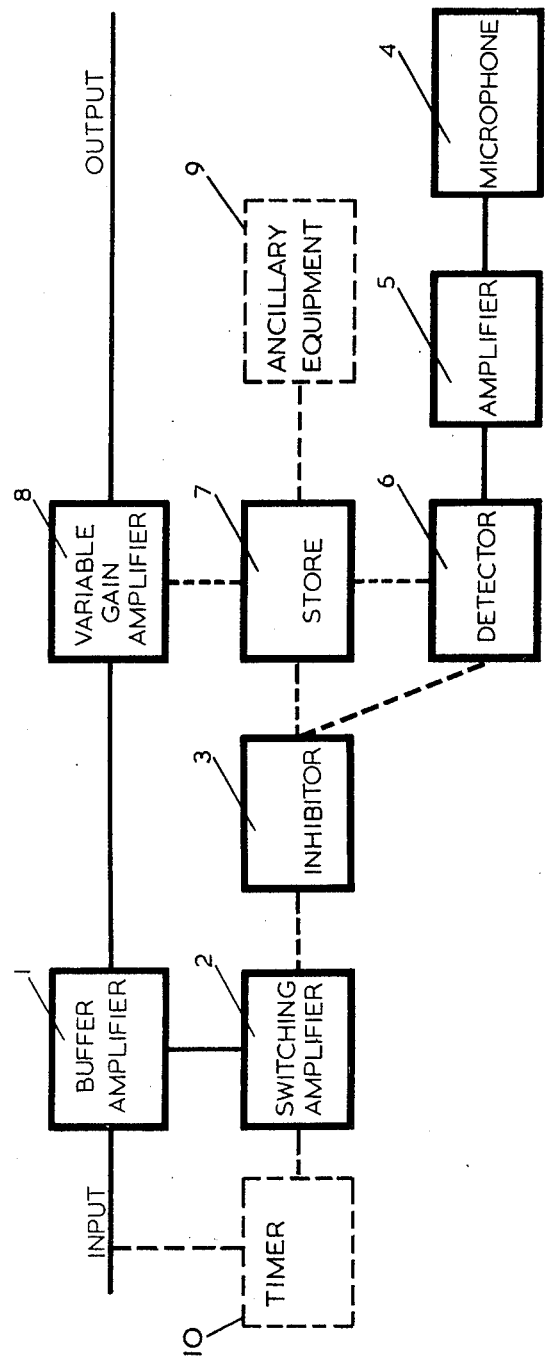

VARIABLE GAIN AMPLIFIER CONTROLLED BY AMBIENT NOISE LEVEL

This invention relates to audio amplifier systems in which the gain of the amplifier is controlled to compensate for changes in level of the ambient background noise level. In such systems it is required that the sound level of the reproduced speech or music should be higher in noisy locations and lower in quieter locations.

Hitherto, the gain of the amplifier has been controlled by a signal from a microphone placed in the area to be covered.

The microphone picked up both the general background noise present and the sound generated by the amplifier system and in order to derive a signal that was proportional to the noise level, for control purposes, a signal was taken directly from the amplifier, adjusted to the correct level, and subtracted from the combined signal obtained from the monitor microphone. Theoretically, the resultant signal was a signal whose amplitude varied with the general noise level in the premises covered by the installation. However, in practice there was the disadvantage that if the 'signal only' and 'signal plus noise' channels were not correctly set up and perfectly balanced there was a tendency for the system to become unstable with the result that the sound output became excessively loud when an increase in noise level occurred or the sound was turned off by a reduction in the noise level.

An object of the present invention is to provide an improved amplifier system in which this disadvantage is mitigated.

According to the invention, there is provided an audio amplifier system comprising a variable gain amplifier adapted to receive an input signal, means for detecting periods when the input signal falls below a predetermined level, sound transducer means arranged to provide a signal proportional to the sound level in the area or a part thereof covered by the system for controlling the gain of the amplifier, and inhibitor means controlled by the detecting means to prevent the change of the gain of the variable gain amplifier except during periods when the input signal falls below the said predetermined level.

Preferably the sound level signal is passed to a store during each of said periods and stored until the next said period. The amplifier gain may then be controlled according to the stored value. Conveniently, the sound level signal is converted to digital form before being stored in a digital store.

An embodiment of the invention will now be described, by way of example, with reference to the accompanying drawing, which is a block schematic diagram of an amplifier system.

An input signal, which represents speech, music, warning signals and the like, is fed to a buffer amplifier 1 to prevent the system loading the signal source and also to isolate the control circuitry from the signal path. The signal from buffer amplifier 1 is fed to a variable gain amplifier 8 and also to a switching amplifier 2 which detects periods when the input signal falls below a predetermined level. This level is set to correspond with a level at which the sound level from loudspeakers fed from the amplifier 8 does not add significantly to the ambient noise level. This level may be set by means of an external control adjusted by an operator, or in a more sophisticated installation the level may be set at a signal level a given amount below a peak signal level, which peak level is determined automatically. Switching amplifier 2 provides a gating signal to an inhibitor 3, the action of which will be discussed later.

In the area to be covered by the loudspeakers there is provided a microphone 4 which provides an electrical signal proportional to the sound pressure level present. Any transducer which will provide such a signal will suffice, for example a loudspeaker similar to the ones used for radiating sound may be used as a microphone thus enabling common parts to be used. The microphone should be placed where it can respond to the general noise level of the area to be covered and care should be taken to ensure that nothing can be placed near it, after installation, to mask the background noise. The output signal from microphone 4 is amplified in an amplifier 5 which has a handling capacity such that it does not overload in the presence of the combined speech or music and the ambient noise signal.

The amplified signal is fed to a detector 6 and has a value which represents the total sound during speech or music and the noise level during quiet periods in between the music or speech. In accordance with the invention a signal from inhibitor 3 controls the output of detector 6 so that an output signal is passed to a store 7 only during quiet periods, i.e. when switching amplifier 2 detects that the signal at buffer amplifier 1 is below the predetermined level. Detector 6 is arranged to follow rapidly the signal from amplifier 5 so that the measure of the background noise level is obtained during a quiet period. If the time constant remains short during the sensing time any sudden change in noise level, e.g. a dropped metallic object, will cause an incorrect level to be detected. Preferably, therefore, the time constant of the detector 6 is increased during the quiet periods.

Since there may be long intervals between quiet periods, for example as long as 5–10 minutes if music is being played, it is necessary to store the detector output in order that the gain of variable gain amplifier 8 does not change during such an interval. As is apparent the gain of amplifier 8 is controlled according to the level stored in store 7. The design of the store depends on the degree of control required. A simple arrangement is to divide the noise level into a number of discrete levels of say 3dB so that it will be necessary to store only a limited number of gain settings. In a more sophisticated arrangement there may be provided an analogue to digital converter which will supply a coded output giving an indication of the detector 6 output.

Depending upon the number of digits used the number of quantizing levels can be made large, e.g. with 10 digits of a binary code the detector output can be split into 1,024 levels, and hence each level represents a small change in ambient noise. This coded signal can, if it is desired, be processed by normal digital techniques, e.g. the threshold of the system can be varied by subtracting a fixed number from the number held in the store. Further refinements may include the variation of the amplifier gain to reduce the sound output at night or to increase the amplitude for announcements of particular importance. In both these cases this is accomplished by processing the digital information held in the store, in the former instance under the control of a time clock and in the latter manually by a supervisory operator. Again by using what is in effect computer techniques it is possible to instruct the unit not to increase the gain above a level which will result in the public address system being overloaded or where the sound level would cause annoyance. The information in the store, after any processing, is used to control the gain of variable gain amplifier 8 under instruction from inhibitor 3.

Variable gain amplifier 8 provides compensation for changes in the level of the ambient background noise so that the music or speech amplification is increased in noisy backgrounds and is decreased in quiet backgrounds. Amplifier 8 includes a variable gain element which is controlled by the signal contained in store 7. Various variable gain elements may be used but suitable elements may include the source to drain resistance of a field effect transistor or the resistance of a photoconductive cell.

Although it has been assumed that an increase or decrease in ambient noise will result in a proportional change in amplifier gain it is possible for a change in noise level to have a greater (or lesser) effect at quieter noise levels merely by altering the characteristics of the detector.

The output of the detector or store may be fed to ancillary equipment 9 such as a recorder for future analysis. Thus in a shop, by study of a record of the noise level one could determine the times when extra staff are needed to deal with popular shopping periods, or again on the basis that more people make more noise the noise level signal could be used to control an air conditioning system.

The output could also be used to initiate warning devices whenever the ambient sound level reaches a predetermined (or dangerous) level.

A further variation is to provide a timer 10 in addition to the switching amplifier 2 whereby at predetermined intervals the timer mutes the input signal for a sampling period. During this period the switching amplifier 2 will detect that the signal has fallen below the predetermined level and the system will behave as previously described. It is arranged that each time the switching amplifier detects that the signal is below the predetermined level it resets the timer; thus the timer will operate only after a preset period of uninterrupted signal. Such a system ensures that the ambient noise is monitored at intervals not exceeding a given length, but with the minimum of unnatural breaks. Arrangements are made to prevent the timer operating if essential announcements are being made.

What is claimed is:

1. An audio amplifier system comprising a variable gain amplifier adapted to receive an input signal and produce an output audio signal therefrom in a signal processing channel, threshold means for detecting periods when the input singal falls below a predetermined level, sound transducer means arranged to provide a noise audio signal proportional to the sound level in the area or a part thereof covered by the system developing a gain control audio signal and gain control means connected for controlling the gain of said variable gain amplifier with said gain control signal, inhibitor means controlled by the threshold means connected to prevent the change of the gain of the variable gain amplifier in response to said noise signal except during periods when the input signal falls below the said predetermined level, a timer arranged to mute the input to the variable gain amplifier at predetermined intervals and further comprising means for resetting the timer each time the input signal falls below the said predetermined level.

2. An audio amplifier system according to claim 1, comprising a store arranged to receive and store the noise audio sound level signal in response to said inhibitor means only during the said periods and to control the gain of said variable gain amplifier during those periods with a stored gain control signal.

3. An audio amplifier system according to claim 2, wherein the store is arranged to control the gain of the amplifier continuously between said periods with said noise audio signal.

4. An audio amplifier system according to claim 2, wherein means are provided to convert the audio sound level signal to digital form for application to the store.

* * * * *